(12) United States Patent
Sun et al.

(10) Patent No.: US 9,952,939 B1
(45) Date of Patent: Apr. 24, 2018

(54) SYSTEM AND METHOD FOR LOWER PAGE DATA RECOVERY IN A SOLID STATE DRIVE

(71) Applicant: Western Digital Technologies, Inc., Irvine, CA (US)

(72) Inventors: Yongke Sun, Pleasanton, CA (US); Dengtao Zhao, Santa Clara, CA (US); Jui-Yao Yang, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 14/700,760

(22) Filed: Apr. 30, 2015

Related U.S. Application Data

(62) Division of application No. 13/708,873, filed on Dec. 7, 2012, now Pat. No. 9,032,271.

(51) Int. Cl.
*G11C 29/00* (2006.01)
*G06F 11/14* (2006.01)

(52) U.S. Cl.
CPC ...... *G06F 11/1458* (2013.01); *G06F 11/1412* (2013.01)

(58) Field of Classification Search
CPC .......................... G06F 11/1048; H03M 13/05
See application file for complete search history.

(56) References Cited

U.S. PATENT DOCUMENTS

| | | | |
|---|---|---|---|
| 6,192,484 B1 * | 2/2001 | Asano | G06F 11/1092 711/114 |
| 6,856,556 B1 | 2/2005 | Hajeck | |
| 7,126,857 B2 | 10/2006 | Hajeck | |
| 7,430,136 B2 | 9/2008 | Merry, Jr. et al. | |

(Continued)

FOREIGN PATENT DOCUMENTS

| | | |
|---|---|---|
| CN | 101246738 A | 8/2008 |
| CN | 101630279 A | 1/2010 |

(Continued)

OTHER PUBLICATIONS

Extended European Search Report from European Applicaton No. 13860448.3, dated Aug. 2, 2016. Japanese Office Action from Japanese Patent Application No. 2015-546458, dated Aug. 1, 2017.
Chinese Office Action from Chinese Application No. 201380064141.3, dated Apr. 19, 2017.
Japanese Office Action from Japanese Patent Application No. 2016-224035, dated Nov. 7, 2017, 11 pages.
Japanese Notice of Allowance from Japanese Patent Application No. 2015-546458, dated Feb. 20, 2018, 4 pages.

*Primary Examiner* — Guy Lamarre
(74) *Attorney, Agent, or Firm* — McDermott Will & Emery LLP

(57) ABSTRACT

In some embodiments of the present invention, a data storage system includes a controller and a non-volatile memory array having a plurality of memory pages. The controller performs a method that efficiently resolves the lower page corruption problem. In one embodiment, the method selects programmed lower page(s) for which paired upper page(s) have not been programmed, reads data from those selected lower page(s), corrects the read data, and reprograms the read data into those lower page(s). Since the number of lower pages in this condition is typically low (e.g., several pages in a block with hundreds or thousands of pages), this is a much more efficient method than reprogramming the entire block. In another embodiment, a similar reprogramming method is applied as a data recovery scheme in situations in which only lower pages are programmed (e.g., SLC memory, MLC memory in SLC mode, etc.).

20 Claims, 6 Drawing Sheets

(56) References Cited

U.S. PATENT DOCUMENTS

| | | |
|---|---|---|
| 7,447,807 B1 | 11/2008 | Merry et al. |
| 7,486,561 B2 | 2/2009 | Mokhlesi |
| 7,489,549 B2 | 2/2009 | Mokhlesi |
| 7,502,256 B2 | 3/2009 | Merry, Jr. et al. |
| 7,509,441 B1 | 3/2009 | Merry et al. |
| 7,596,643 B2 | 9/2009 | Merry, Jr. et al. |
| 7,633,802 B2 | 12/2009 | Mokhlesi |
| 7,653,778 B2 | 1/2010 | Merry, Jr. et al. |
| 7,685,337 B2 | 3/2010 | Merry, Jr. et al. |
| 7,685,338 B2 | 3/2010 | Merry, Jr. et al. |
| 7,685,374 B2 | 3/2010 | Diggs et al. |
| 7,733,712 B1 | 6/2010 | Walston et al. |
| 7,765,373 B1 | 7/2010 | Merry et al. |
| 7,898,855 B2 | 3/2011 | Merry, Jr. et al. |
| 7,912,991 B1 | 3/2011 | Merry et al. |
| 7,936,603 B2 | 5/2011 | Merry, Jr. et al. |
| 7,962,792 B2 | 6/2011 | Diggs et al. |
| 8,046,528 B2 | 10/2011 | Chu et al. |
| 8,078,918 B2 | 12/2011 | Diggs et al. |
| 8,090,899 B1 | 1/2012 | Syu |
| 8,095,851 B2 | 1/2012 | Diggs et al. |
| 8,108,692 B1 | 1/2012 | Merry et al. |
| 8,122,185 B2 | 2/2012 | Merry, Jr. et al. |
| 8,127,048 B1 | 2/2012 | Merry et al. |
| 8,135,903 B1 | 3/2012 | Kan |
| 8,151,020 B2 | 4/2012 | Merry, Jr. et al. |
| 8,161,227 B1 | 4/2012 | Diggs et al. |
| 8,166,245 B2 | 4/2012 | Diggs et al. |
| 8,238,157 B1 | 8/2012 | Sommer et al. |
| 8,243,525 B1 | 8/2012 | Kan |
| 8,248,831 B2 | 8/2012 | Rotbard et al. |
| 8,254,172 B1 | 8/2012 | Kan |
| 8,261,012 B2 | 9/2012 | Kan |
| 8,296,625 B2 | 10/2012 | Diggs et al. |
| 8,312,207 B2 | 11/2012 | Merry, Jr. et al. |
| 8,316,176 B1 | 11/2012 | Phan et al. |
| 8,341,339 B1 | 12/2012 | Boyle et al. |
| 8,375,151 B1 | 2/2013 | Kan |
| 8,392,635 B2 | 3/2013 | Booth et al. |
| 8,397,107 B1 | 3/2013 | Syu et al. |
| 8,407,449 B1 | 3/2013 | Colon et al. |
| 8,423,722 B1 | 4/2013 | Deforest et al. |
| 8,433,858 B1 | 4/2013 | Diggs et al. |
| 8,443,167 B1 | 5/2013 | Fallone et al. |
| 8,447,920 B1 | 5/2013 | Syu |
| 8,458,435 B1 | 6/2013 | Rainey, III et al. |
| 8,478,930 B1 | 7/2013 | Syu |
| 8,489,854 B1 | 7/2013 | Colon et al. |
| 8,503,237 B1 | 8/2013 | Horn |
| 8,521,972 B1 | 8/2013 | Boyle et al. |
| 8,549,236 B2 | 10/2013 | Diggs et al. |
| 8,583,835 B1 | 11/2013 | Kan |
| 8,601,311 B2 | 12/2013 | Horn |
| 8,601,313 B1 | 12/2013 | Horn |
| 8,612,669 B1 | 12/2013 | Syu et al. |
| 8,612,804 B1 | 12/2013 | Kang et al. |
| 8,615,681 B2 | 12/2013 | Horn |
| 8,638,602 B1 | 1/2014 | Horn |
| 8,639,872 B1 | 1/2014 | Boyle et al. |
| 8,683,113 B2 | 3/2014 | Abasto et al. |
| 8,700,834 B2 | 4/2014 | Horn et al. |
| 8,700,950 B1 | 4/2014 | Syu |
| 8,700,951 B1 | 4/2014 | Call et al. |
| 8,706,985 B1 | 4/2014 | Boyle et al. |
| 8,707,104 B1 | 4/2014 | Jean |
| 8,713,066 B1 | 4/2014 | Lo et al. |
| 8,713,357 B1 | 4/2014 | Jean et al. |
| 8,719,531 B2 | 5/2014 | Strange et al. |
| 8,724,422 B1 | 5/2014 | Agness et al. |
| 8,725,931 B1 | 5/2014 | Kang |
| 8,745,277 B2 | 6/2014 | Kan |
| 8,751,728 B1 | 6/2014 | Syu et al. |
| 8,769,190 B1 | 7/2014 | Syu et al. |
| 8,769,232 B2 | 7/2014 | Suryabudi et al. |
| 8,775,720 B1 | 7/2014 | Meyer et al. |
| 8,782,327 B1 | 7/2014 | Kang et al. |
| 8,788,778 B1 | 7/2014 | Boyle |
| 8,788,779 B1 | 7/2014 | Horn |
| 8,788,880 B1 | 7/2014 | Gosla et al. |
| 8,793,429 B1 | 7/2014 | Call et al. |
| 9,032,271 B2 | 5/2015 | Sun et al. |
| 9,268,634 B2 * | 2/2016 | Lin ............... G06F 11/1008 |
| 2003/0033567 A1 | 2/2003 | Tamura et al. |
| 2006/0245249 A1 | 11/2006 | Hwang |
| 2007/0091677 A1 * | 4/2007 | Lasser ............... G06F 11/1068 |
| | | 365/185.09 |
| 2007/0297245 A1 | 12/2007 | Mokhlesi |
| 2008/0177934 A1 | 7/2008 | Yu et al. |
| 2009/0235016 A1 | 9/2009 | Yano et al. |
| 2009/0307413 A1 | 12/2009 | Chu |
| 2010/0157675 A1 | 6/2010 | Shalvi et al. |
| 2010/0174849 A1 | 7/2010 | Walston et al. |
| 2010/0246260 A1 | 9/2010 | Kang |
| 2010/0250793 A1 | 9/2010 | Syu |
| 2010/0318839 A1 | 12/2010 | Avila et al. |
| 2011/0083039 A1 | 4/2011 | Kim et al. |
| 2011/0099323 A1 | 4/2011 | Syu |
| 2011/0161554 A1 | 6/2011 | Selinger et al. |
| 2011/0202710 A1 | 8/2011 | Zhao et al. |
| 2011/0283049 A1 | 11/2011 | Kang et al. |
| 2012/0054582 A1 * | 3/2012 | Byom ............... G11C 16/26 |
| | | 714/773 |
| 2012/0226959 A1 * | 9/2012 | Xie ............... G06F 11/1048 |
| | | 714/763 |
| 2012/0260020 A1 | 10/2012 | Suryabudi et al. |
| 2012/0278531 A1 | 11/2012 | Horn |
| 2012/0284460 A1 | 11/2012 | Guda |
| 2012/0284587 A1 * | 11/2012 | Yu ............... G06F 3/0608 |
| | | 714/773 |
| 2012/0297259 A1 * | 11/2012 | Haufe et al. ............ G06F 11/24 |
| | | 714/726 |
| 2012/0324191 A1 | 12/2012 | Strange et al. |
| 2013/0132638 A1 | 5/2013 | Horn et al. |
| 2013/0145106 A1 | 6/2013 | Kan |
| 2013/0290793 A1 | 10/2013 | Booth et al. |
| 2014/0059405 A1 | 2/2014 | Syu et al. |
| 2014/0101369 A1 | 4/2014 | Tomlin et al. |
| 2014/0115427 A1 | 4/2014 | Lu |
| 2014/0133220 A1 | 5/2014 | Danilak et al. |
| 2014/0136753 A1 | 5/2014 | Tomlin et al. |
| 2014/0149826 A1 | 5/2014 | Lu et al. |
| 2014/0157078 A1 | 6/2014 | Danilak et al. |
| 2014/0181432 A1 | 6/2014 | Horn |
| 2014/0223255 A1 | 8/2014 | Lu et al. |
| 2015/0303948 A1 * | 10/2015 | Yoon ............... G11C 29/52 |
| | | 714/764 |
| 2015/0331748 A1 * | 11/2015 | Cohen ............... G06F 11/1076 |
| | | 714/764 |

FOREIGN PATENT DOCUMENTS

| | | |
|---|---|---|
| CN | 101809541 A | 8/2010 |
| JP | 2003-058432 A | 2/2003 |
| JP | 2009-048680 A | 3/2009 |
| JP | 2009-048750 A | 3/2009 |
| JP | 2009-205555 A | 9/2009 |
| JP | 2009-536423 A | 10/2009 |
| JP | 2010-067098 A | 3/2010 |
| JP | 2010-537314 A | 12/2010 |
| JP | 2011-128751 A | 6/2011 |
| JP | 2012-123856 A | 6/2012 |
| JP | 2012-164072 A | 8/2012 |
| JP | 2013-089082 A | 5/2013 |
| WO | WO-2009/025857 A1 | 2/2009 |
| WO | WO-2011/056483 A1 | 5/2011 |

* cited by examiner

= open lower page

SYSTEM AND METHOD FOR LOWER PAGE DATA RECOVERY IN A SOLID STATE DRIVE

CROSS REFERENCE TO RELATED APPLICATIONS

This application is a divisional of U.S. patent application Ser. No. 13/708,873, filed Dec. 7, 2012, now U.S. Pat. No. 9,032,271, the contents of all of which are incorporated herein by reference in their entirety.

BACKGROUND

Technical Field

This disclosure relates to data storage systems, such as solid state drives, for computer systems. More particularly, the disclosure relates to lower page data recovery.

Description of the Related Art

Memory arrays with multi-level cell (MLC) NAND media are now commonplace in solid state drives (SSDs). MLC allows multiple possible states to exist in a single memory cell, thereby enabling the storing of more than one bit of information per cell (e.g., 2, 3, 4 or more). For example, in a 2-bit-per cell MLC flash, 4 possible states (4 voltage (Vt) levels) are possible which enable storage of 2 bits. Based on the data the memory cells are going to store and the coding for different states, the cells are programmed to 4 possible and distinctive Vt zones. Typically, data stored in lower pages and upper pages are logically paired together, with the lower pages being programmed first.

BRIEF DESCRIPTION OF THE DRAWINGS

Systems and methods that embody the various features of the invention will now be described with reference to the following drawings, in which.

DETAILED DESCRIPTION OF SPECIFIC EMBODIMENTS

While certain embodiments are described, these embodiments are presented by way of example only, and are not intended to limit the scope of protection. Indeed, the novel methods and systems described herein may be embodied in a variety of other forms. Furthermore, various omissions, substitutions, and changes in the form of the methods and systems described herein may be made without departing from the scope of protection.

Overview

In MLC flash memory, even though the lower pages and upper pages are physically paired, they are generally decoupled in programming. The data stored in lower pages and upper pages can be programmed at different time and from different sources. There are often cases where the upper pages are programmed much later and at different temperature. Most time, there are no problems for this programming scheme. However, various factors including temperature and aging effects of the memory cells can degrade retention of the data in the cells and may lead to the problem of lower page corruption when the storage system attempts to program the upper page.

One way to overcome the lower page corruption problem is to move the old data of the entire open block to another new address when there is a need to program the upper page. In this manner, the lower page and upper page are programmed at the same time under the similar condition. However, this method is inefficient.

In some embodiments of the present invention, a data storage system includes a controller and a non-volatile memory array having a plurality of memory pages. The controller performs a method that may require less system load while still preventing the lower page corruption problem discussed above. In one embodiment, the method selects programmed lower page(s) for which paired upper page(s) have not been programmed, reads data from those selected lower page(s), corrects the read data, and reprograms the read data into those lower page(s). Since the number of lower pages in this condition is typically low (e.g., several pages in a block with hundreds or thousands of pages), this is a much more efficient method than reprogramming the entire block. In another embodiment, a similar reprogramming method is applied as a data recovery scheme in situations in which only lower pages are programmed (e.g., SLC (single-level cell) memory, MLC memory in SLC mode, etc.).

System Overview

Figure 1:
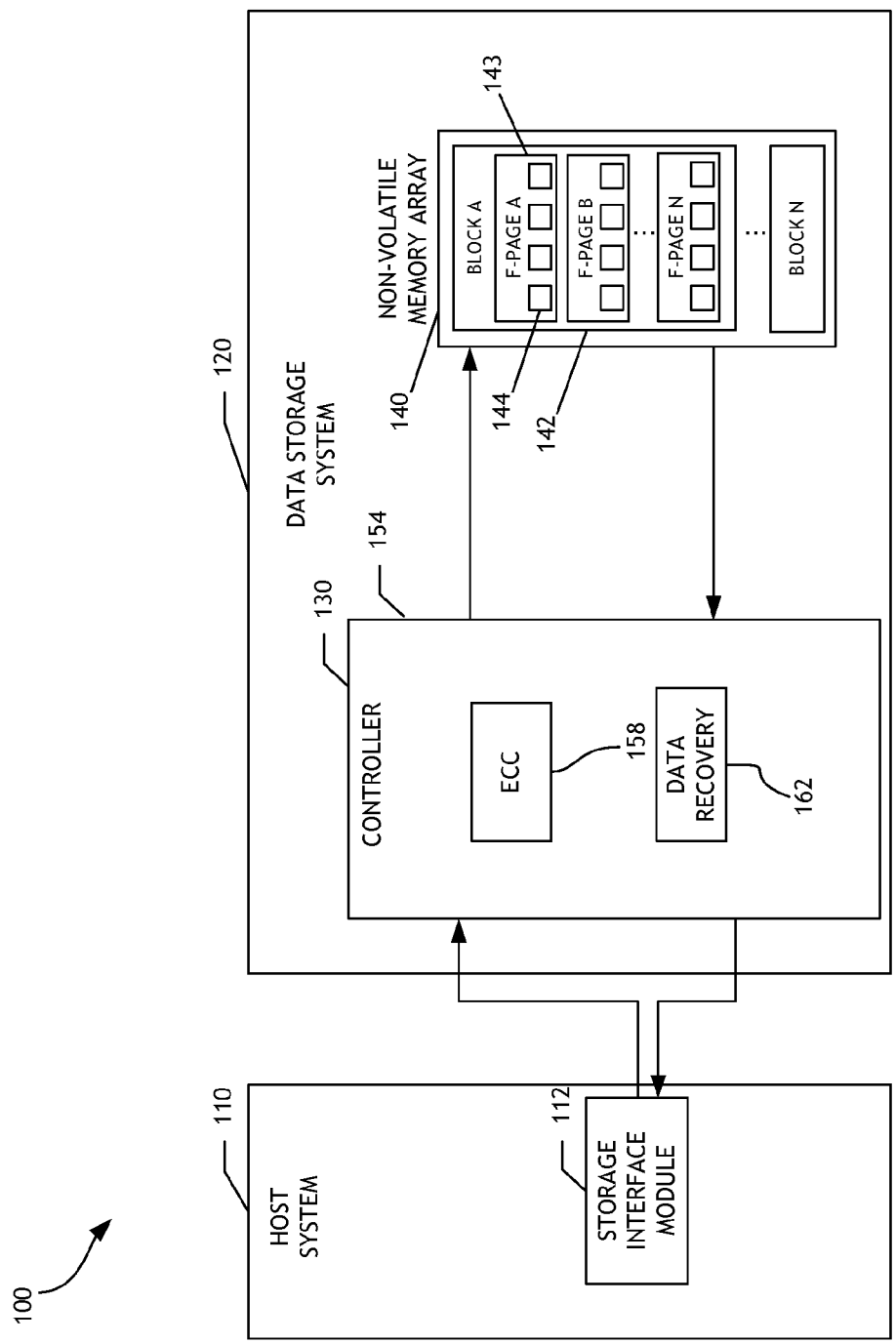
FIG. 1 illustrates a storage system that reprograms data according to one embodiment of the invention.

FIG. 1 illustrates a storage system 120 that performs reprogramming for data recovery according to one embodiment of the invention. As is shown, a storage system 120 (e.g., solid state drive, hybrid hard drive, etc.) includes a controller 130 and a non-volatile memory array 140, which includes one or more blocks of memory storage, identified as Block "A" 142 through Block "N". Each block includes flash pages (F-pages). For example, Block A 142 of FIG. 1 includes F-pages identified as F-pages A 153, B, through N. In some embodiments, each "F-page" is a smallest grouping of memory cells in the non-volatile memory array 140 that can be programmed in a single operation or as a unit. Further, each F-page includes error correcting code pages (E-pages). In the illustrated embodiment, each F-page includes four E-pages that are illustrated as four boxes, including E-page 144. Other embodiments may use F-pages or E-pages that are defined differently or each F-page may include greater or fewer than four E-pages.

The controller 130 can receive data and/or storage access commands from a storage interface module 112 (e.g., a device driver) in a host system 110. Storage access commands communicated by the storage interface 112 can include write and read commands issued by the host system 110. The commands can specify a logical block address in the storage system 120, and the controller 130 can execute the received commands in the non-volatile memory array 140. In a hybrid hard drive, data may be stored in magnetic media storage component (not shown in FIG. 1) in addition to the non-volatile memory array 140.

In one embodiment, the controller 130 includes an ECC module 158. In one embodiment, the ECC module 158 handles error correction of data read from the memory array 140. In one embodiment, it encodes data to be written to memory pages, such as E-pages, of the non-volatile memory array 140 and decodes the data when they are read out. The controller 130 in one embodiment also includes a data recovery module 162 which performs the reprogramming methods in accordance with one or more embodiments of the invention, as further described below.

Voltage Distribution Illustration

Figure 2A:
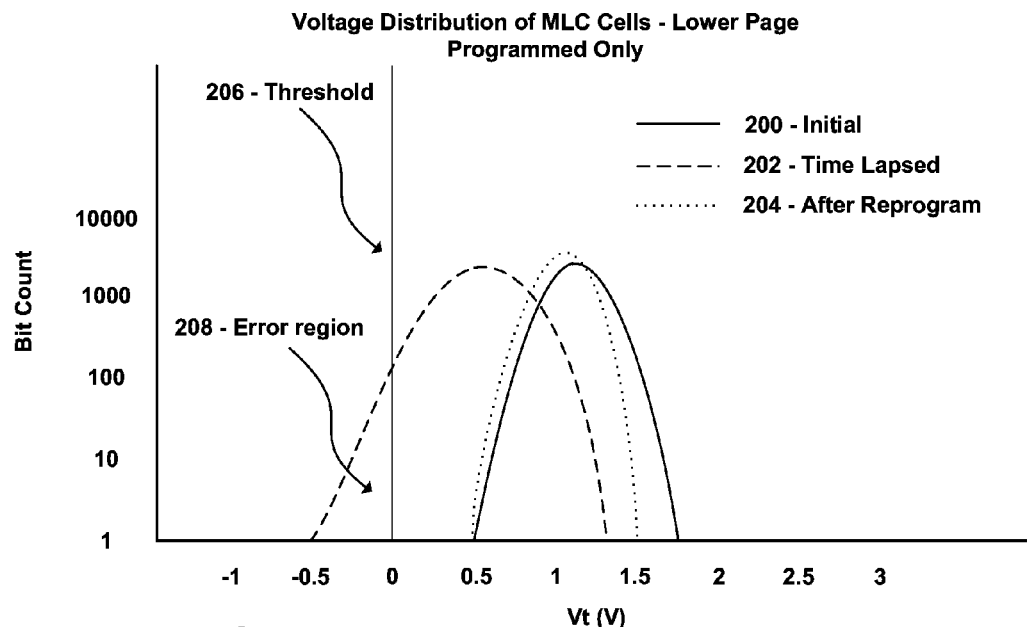
FIGS. 2A and 2B show the voltage distribution of memory cells to illustrate the factors that contribution to lower page corruption and a solution according to one embodiment of the invention.
Figure 2B:
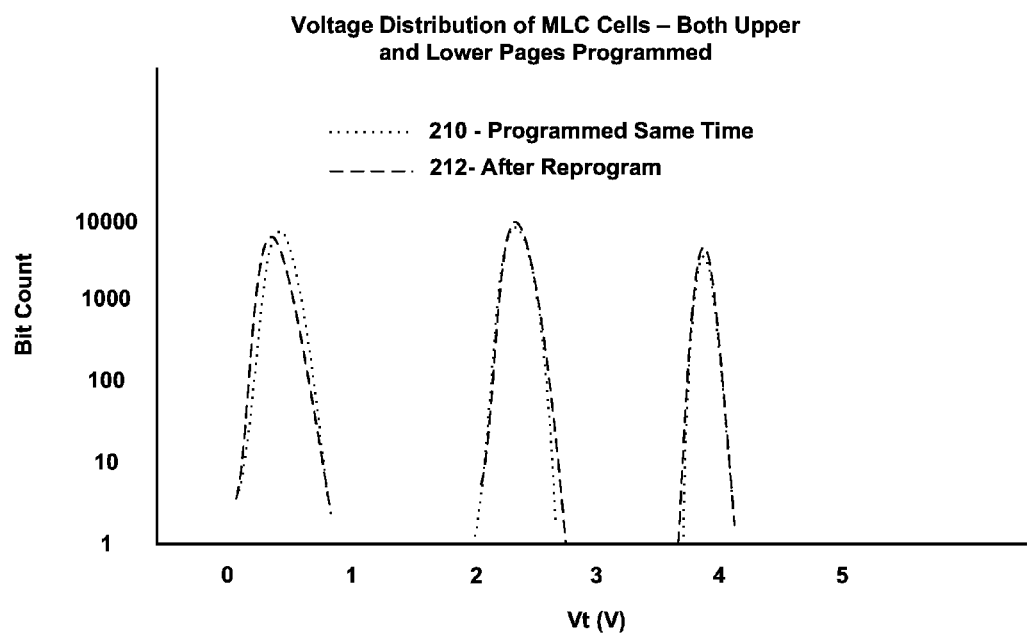

FIGS. 2A and 2B show the voltage distribution of memory cells to illustrate the factors that contribution to lower page corruption and a solution according to one embodiment of the invention. FIG. 2A shows the voltage distribution of MLC memory cells in which only the lower pages have been programmed. Line 200 shows the voltage distribution at the point of initial programming. Line 202 shows the voltage distribution after some time has lapsed. In FIG. 2A, those cells have undergone a testing process where they are heated to simulate a time lapse of approximately 12.6 months at 40° C. It can be seen that the distribution has drifted to the left on the voltage scale, such that some cells are now in the error region 208. These cells, if read, would likely result in a different bit value than the initial programmed value, because their voltage level is now below threshold 206. Thus these hundreds of bits are now in error. Line 204 shows the distribution after the cells have been reprogrammed in according to one or more embodiments of the invention. The distribution is now nearly identical to the distribution at the time of initial programming, and the failing bit count (FBC) is zero.

FIG. 2B shows the voltage distribution of MLC memory cells in which both the lower and upper pages have been programmed. This graph does not show the effect of the voltage drifts. Rather, it illustrates two scenarios. First, line 210 shows the voltage distribution of the Vt states of the cells in which both the upper and lower pages are programmed at the same time or nearly the same time. This would be considered an ideal condition since there is little to no time lapsed, and little to no temperature differences between the two programming. However, this is not always how the cells are programmed. If the upper page is programmed at a different time and/or temperature than the lower page, the lower page corruption problem can occur. However, the reprogramming of the lower page reduces the risk of this problem. Line 212 shows the voltage distribution after the cells have been reprogrammed according to one or more embodiments of the invention. As shown, after reprogramming all three states are aligned very closely to the distribution shown in line 210, which, as mentioned above reflects the distribution of cells where upper and lower pages have been programmed at the same or nearly the same time.

Reprogramming

Figure 3:
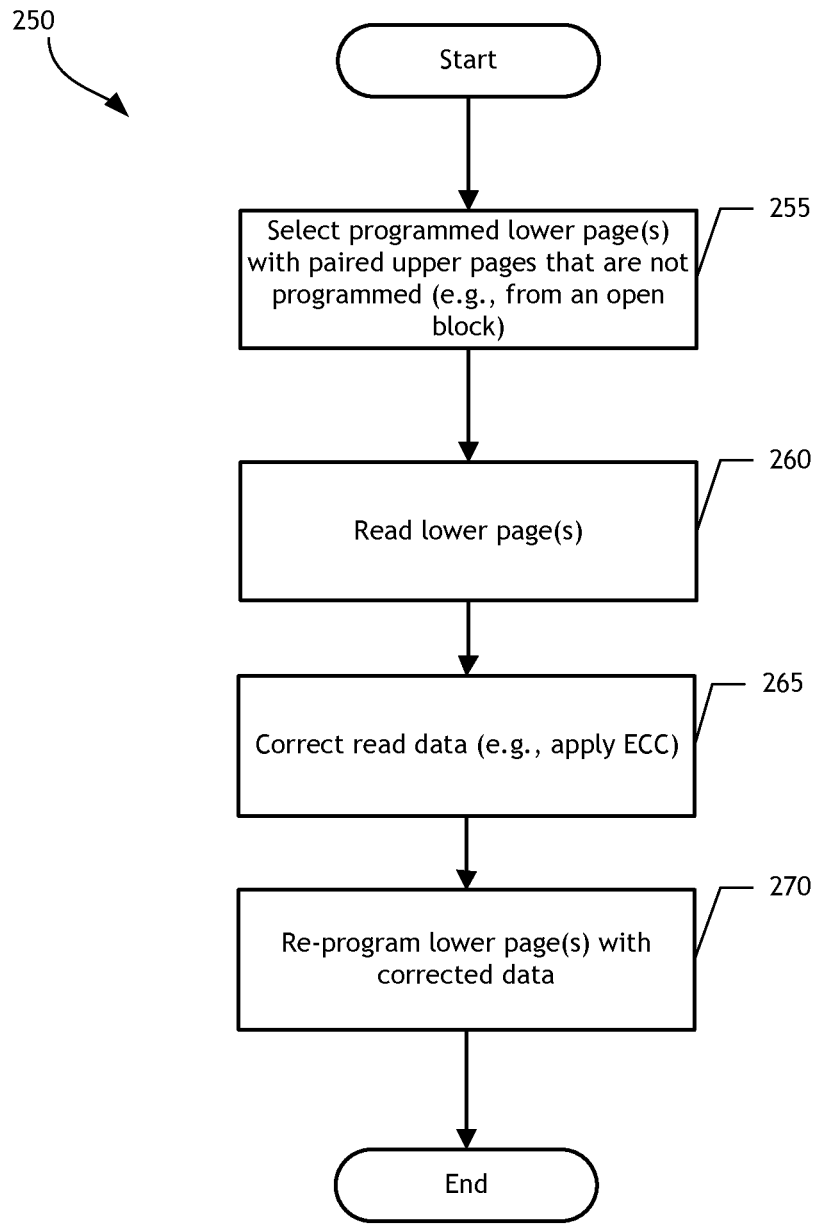
FIG. 3 is a flow diagram showing a method of reprogramming according to one embodiment of the invention.

FIG. 3 is a flow diagram showing a method 250 of reprogramming according to one embodiment of the invention. The method 250 may be executed as part of a start-up sequence, on a periodic basis, or on an as-needed basis. In one embodiment, the method 250 is performed by the controller 130 shown in FIG. 1. At block 255, the method selects programmed lower page(s) with paired upper pages that are not programmed. These lower page(s) may be referred to as "open" lower pages. For example, the method may select such pages from one or more "open" blocks in which data is currently being programmed. To illustrate further, if the method 250 is executed as part of a start-up sequence, such open blocks may be blocks that were being programmed when the storage system was last shut down, and they have not been closed since their capacity have not been filled. Since the system is likely to resume programming in these open blocks, the lower page corruption problem may occur in these open lower page(s). Therefore, in one embodiment, the method selects such open lower pages for reprogramming.

At block 260, the data from the selected lower pages are read, and then the read data is corrected (e.g., through the application of Error Correction Code (ECC)) at block 265. Then, at block 270, the corrected data is reprogrammed back to the selected lower pages. As previously shown in FIG. 2A, the voltage distribution of the cells in these lower pages now closely resembles the distribution when they were initially programmed. Thus, when their paired upper pages are programmed, the lower page corruption problem can be avoided.

Selecting Lower Pages

Figures 4A, 4B:
FIGS. 4A-4B and 5 show the different memory cell configuration in which open lower pages may be selected for reprogramming according to embodiments of the invention.
Figure 5:
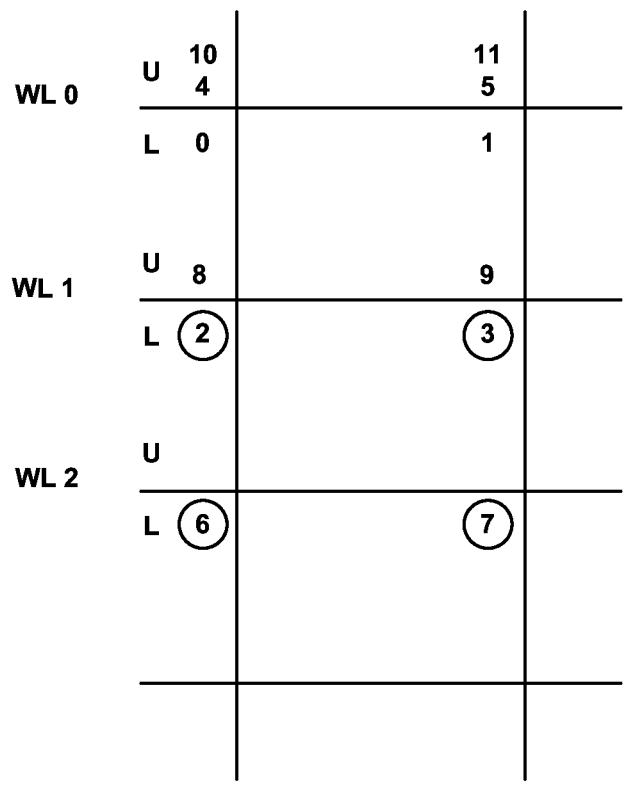

FIGS. 4A-4B and 5 show the different memory cell configuration in which open lower pages may be selected. In FIG. 4A, an MLC configuration is presented and pages 0-7 are shown. The "U" denotes an upper page and the "L" denotes a lower page. From top to bottom, the horizontal lines represent word lines, and they are labeled (between FIGS. 4A and 4B) WL (Word Line) 0, WL 1, WL 2, and so on.

The page number denotes the order in which pages are programmed. Here, pages 0-7 have been programmed. Page 0, a lower page in WL 0 is first programmed, and then page 1, a lower page in the same WL 0 is programmed, and so on. Note that page 0 is paired with upper page 4, and page 1 is paired with upper page 5, and so on. In this programming sequence, pages 2, 3, 6, and 7 are open lower pages that do not have their paired upper pages programmed. In one embodiment, if the controller finds the state of the memory as shown in FIG. 4A, these pages will be selected for reprogramming, for example, according to the method shown in FIG. 2. In this typical configuration, there is a maximum of 4 such open pages at a given time. Thus, to reprogram these open pages is much more efficient than reprogram data from the entire memory block. In one embodiment, these open pages may be flagged (e.g., through metadata) by the controller as part of a shutdown sequence, so that any such open lower pages in open blocks can be quickly identified at start-up. If the indication for such open lower pages is not available (e.g., a previous ungraceful/unexpected shutdown has occurred or the system does not support marking such pages), the controller may perform scanning through the memory blocks to locate such open lower pages.

FIG. 4B shows the same memory cells after the programming of pages 8 and 9. In the current example, just before pages 8 and 9 are programmed, a reprogram has taken place to read out data from pages 2 and 3, the corrected data is reprogrammed back to pages 2 and 3. Thus, lower page corruption of pages 2 and 3 can be avoided when pages 8 and 9 are programmed. With pages 8 and 9 programmed, pages 2 and 3 are no longer open. If the system shut downs at this point, at the next start-up the controller may select pages 6 and 7 for reprogramming.

FIG. 5 shows another MLC configuration in which each cell is configured to encode 3 bits. This configuration is commonly referred to as TLC (Three-Level Cell) memory. The same notations apply here as with FIGS. 4A-4B. The programmed pages are labeled pages 0-11 with U and L designations and the word lines are labeled accordingly. Here, each lower page is paired with two upper pages. For example, page 0 is paired with upper pages 4 and 10. Pages 2, 3, 6, and 7 are open lower pages. Accordingly to one embodiment, if the controller finds the memory in this illustrated state, these pages would be selected for reprogramming. Note that pages 2 and 3 are considered open pages even though they are already paired with programmed upper pages 8 and 9. This is because each of pages 2 and 3 has one more upper page to be programmed. Again, reprogramming these few open pages is more efficient than reprogramming the entire block of memory.

Lower Page Only Reprogramming

Figure 6:
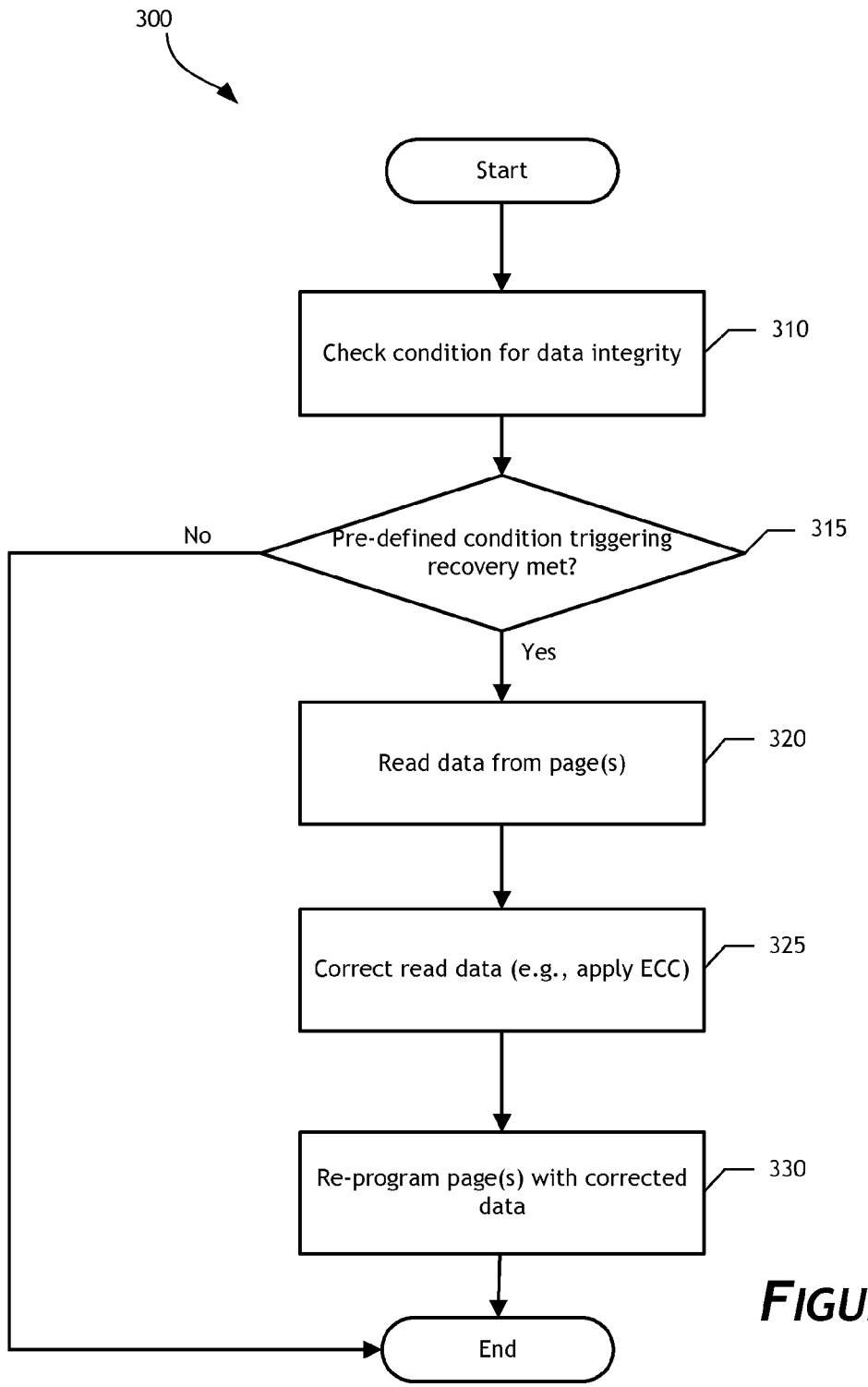
FIG. 6 is a flow diagram illustrating a process of reprogramming lower page programmed only cells according to one embodiment of the invention.

FIG. 6 is a flow diagram illustrating a process of reprogramming lower page programmed only cells according to one embodiment of the invention. Another situation the lower page recovery program may be useful is where only lower pages are programmed for data storage. Typically these pages are in memory blocks that have been designated to operate in a lower page only or SLC mode. Alternatively, the same scenario can occur in SLC memory. Because the upper pages are not programmed, lower page corruption problem does not occur. However, there are instances where reprogramming may nonetheless be useful to preserve data integrity. For example, in one embodiment, when the storage system finds that the data are close to some predefined criteria, recovery program may be then applied to bring the programmed voltage level back up to where it is supposed to be.

In FIG. 6, the method 600 may be performed by the controller 130. The method starts at block 610 where one or more data integrity conditions are checked. Error rate such as bit failure rate and/or error correction effort applied (e.g., in the LDPC decoding and/or RAID recovery) from recent reads may be indications of the data integrity condition. The rates/conditions may be obtained from reads that are performed as part of a scanning process. In addition, other useable indications of integrity condition may include program erase cycle counter values and time lapsed approximated by voltage reference drift measured in reference pages/blocks. These conditions may be compared against a threshold metric at block 315, and when certain pre-defined conditions for triggering recovery are met, the method goes to block 320 to read data from these pages where only lower page are programmed. The read data is corrected (e.g., through the application of ECC) at block 325. Then at block 330 the corrected data is reprogrammed back to the pages. As previously shown in FIG. 2A, the voltage distribution of the cells in these pages now closely resembles the distribution when they were initially programmed.

Other Variations

Those skilled in the art will appreciate that in some embodiments, other approaches and methods can be used. For example, if multi-pass programming is allowed for upper pages by finite-state machine on NAND flash chips, it is also possible to apply the methods in the various embodiments for upper page data recovery. For example, some upper pages may be causing an amount of errors that is near the correction limit of the ECC and may benefit from reprogramming to move the voltage levels to near the original programmed levels. In addition, the non-volatile memory array 140 can be implemented using memory devices other than NAND flash memory devices. Other types of solid-state memory devices can alternatively be used, such as array of flash integrated circuits, Chalcogenide RAM (C-RAM), Phase Change Memory (PC-RAM or PRAM), Programmable Metallization Cell RAM (PMC-RAM or PMCm), Ovonic Unified Memory (OUM), Resistance RAM (RRAM), NOR memory, EEPROM, Ferroelectric Memory (FeRAM), Magnetoresistive RAM (MRAM), other discrete NVM (non-volatile memory) chips, or any combination thereof. In one embodiment, the non-volatile memory array 140 preferably includes multi-level cell (MLC) devices having multi-level cells capable of storing more than a single bit of information, although single-level cell (SLC) memory devices or a combination of SLC and MLC devices may be used. In one embodiment, the storage system 120 can include other memory modules, such as one or more magnetic memory modules. The storage system 120 can further include other types of storage media, such as magnetic storage. Accordingly, the scope of the present disclosure is intended to be defined only by reference to the appended claims.

While certain embodiments have been described, these embodiments have been presented by way of example only, and are not intended to limit the scope of the protection. Indeed, the novel methods and systems described herein may be embodied in a variety of other forms. Furthermore, various omissions, substitutions and changes in the form of the methods and systems described herein may be made without departing from the spirit of the protection. The accompanying claims and their equivalents are intended to cover such forms or modifications as would fall within the scope and spirit of the protection. For example, the systems and methods disclosed herein can be applied to hybrid hard drives and the like. In addition, other forms of storage (e.g., DRAM or SRAM, battery backed-up volatile DRAM or SRAM devices, EPROM, EEPROM memory, etc.) may additionally or alternatively be used. As another example, the various components illustrated in the figures may be implemented as software and/or firmware on a processor, ASIC/FPGA, or dedicated hardware. Also, the features and attributes of the specific embodiments disclosed above may be combined in different ways to form additional embodiments, all of which fall within the scope of the present disclosure. Although the present disclosure provides certain preferred embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

What is claimed is:

1. A solid-state storage system, including:
    a non-volatile flash memory array including a plurality of memory blocks, each including a plurality of memory pages; and
    a controller configured to:
        determine whether a state of the storage system meets a pre-defined data integrity condition;
        in response to determining that the state of the storage system meets the pre-defined data integrity condition, select a memory page from the plurality of memory blocks;
        read data from the selected memory page;
        apply error correction to the read data to generate corrected data; and
        program the corrected data back to the selected memory page.

2. The solid-state storage system of claim 1, wherein the state of the storage system includes a state of a memory page in a reference memory block.

3. The solid-state storage system of claim 2, wherein the state of the memory page in the reference memory block comprises a failure bit rate.

4. The solid-state storage system of claim 3, wherein the failure bit rate is used to approximate time lapsed since last programmed.

5. The solid-state storage system of claim 3, wherein the failure bit rate is obtained from a scanning process.

6. The solid-state storage system of claim 1, wherein the non-volatile flash memory array comprises multi-level memory (MLC) cells and the memory page is in a memory block that is lower-page only programmed.

7. The solid-state storage system of claim 1, wherein the non-volatile flash memory array comprises single-level memory (SLC) cells.

8. The solid-state storage system of claim 1, wherein the controller is configured to determine whether the state of the storage system meets the pre-defined condition to initiate data recovery as part of a startup sequence.

9. The solid-state storage system of claim 8, wherein the state of the storage system includes a program-erase cycle count.

10. A method of preserving data integrity in a solid-state storage system that includes a non-volatile flash memory array including a plurality of memory blocks, each including a plurality of memory pages, the method including:
    determining whether a state of the storage system meets a pre-defined data integrity condition;
    in response to determining that the state of the storage system meets the pre-defined data integrity condition, selecting a memory page from the plurality of memory blocks;
    reading data from the selected memory page;
    applying error correction to the read data to generate corrected data; and
    programming the corrected data back to the selected memory page.

11. The method of claim 10, wherein the state of the storage system includes a state of a memory page in a reference memory block.

12. The method of claim 11, wherein the state of the memory page in the reference memory block comprises a failure bit rate.

13. The method of claim 12, wherein the failure bit rate is used to approximate time lapsed since last programmed.

14. The method of claim 12, wherein the failure bit rate is obtained from a scanning process.

15. The method of claim 10, wherein the non-volatile flash memory array comprises multi-level memory (MLC) cells and the memory page is in a memory block that is lower-page only programmed.

16. The method of claim 10, wherein the non-volatile flash memory array comprises single-level memory (SLC) cells.

17. The method of claim 10, wherein determining whether the state of the storage system meets the pre-defined condition to initiate data recovery is performed as part of a startup sequence.

18. The method of claim 17, wherein the state of the storage system includes a program-erase cycle count.

19. The solid-state storage system of claim 1, wherein the state of the storage system is based on a voltage reference drift measured in a reference page.

20. The method of claim 10, wherein the state of the storage system is based on a voltage reference drift measured in a reference page.

* * * * *